United States Patent [19]

Akcasu

[11] Patent Number: 4,644,383
[45] Date of Patent: Feb. 17, 1987

[54] SUBCOLLECTOR FOR OXIDE AND JUNCTION ISOLATED IC'S

[75] Inventor: Osman E. Akcasu, Puyallup, Wash.

[73] Assignee: Harris Corporation, Melbourne, Fla.

[21] Appl. No.: 720,679

[22] Filed: Apr. 8, 1985

[51] Int. Cl.⁴ .......................................... H01L 27/04
[52] U.S. Cl. ...................................... 357/50; 357/20; 357/48; 357/89; 148/DIG. 37; 148/DIG. 145
[58] Field of Search ............. 148/DIG. 37, DIG. 145; 357/20, 50, 48, 89

[56] References Cited

U.S. PATENT DOCUMENTS

| | | | |
|---|---|---|---|
| 3,510,736 | 5/1970 | Dingwall | 357/20 |
| 3,622,842 | 11/1971 | Oberai | 357/48 |
| 3,677,837 | 7/1972 | Ashar | 357/20 |
| 3,709,746 | 1/1973 | De Witt | 357/48 |
| 3,761,319 | 9/1973 | Shannon | 357/20 |
| 3,976,512 | 8/1976 | de Nora et al. | 357/20 |
| 4,079,408 | 3/1978 | Kwap | 357/20 |
| 4,116,732 | 9/1978 | Shier | 357/20 |
| 4,190,466 | 2/1980 | Bhattacharyya et al. | 357/50 |
| 4,190,949 | 3/1980 | Ikeda et al. | 148/175 |
| 4,202,005 | 5/1980 | Sanders | 357/20 |

Primary Examiner—William D. Larkins
Attorney, Agent, or Firm—Barnes & Thornburg

[57] ABSTRACT

A vertical bipolar transistor having a subcollector region of two different thicknesses is provided to increase packing density. The thicker portion lies beneath the area between the emitter and the collector contact. A single additional masking step is needed to provide the dual thickness subcollector region.

10 Claims, 8 Drawing Figures

4,644,383

SUBCOLLECTOR FOR OXIDE AND JUNCTION ISOLATED IC'S

BACKGROUND AND SUMMARY OF THE INVENTION

The present invention relates generally to bipolar transistors and more specifically to bipolar transistors having a buried subcollector structure.

Bipolar transistors are generally built with a low impurity concentration collector region. To reduce the collector resistance, a subcollector is usually provided in the bottom of the collector region and spaced from the base region to allow a low resistance path for connection to the top of the collector. In circuits wherein the collector is junction isolated from the substrate in which it is built, the buried collector region is provided to reduce the current gain of the parasitic substrate transistor which is formed between the base collector and the substrate regions. The lateral isolation in these circuits may either be junction, dielectric or a combination of junction and dielectric.

The general method of forming the buried region is to introduce impurities into the base region before the formation of the collector layer which may be formed for example, by epitaxial deposition. This results in the diffusion down into the substrate region as well as to some updiffusion into the epitaxial layer. The subcollector region is driven deep into the substrate to maintain a desired sheet resistance of a reasonable impurity concentration at the collector-substrate junction or interface. For a collector layer having a thickness of approximately 1.6 microns, the general diffusion depth of the buried collector region into the substrate is approximately 3.37 microns. With such deep drive-in of the subcollector into the substrate, a substantial amount of space must be left between the lateral isolation and the subcollector region because of lateral diffusion which takes place during the deep drive-in. To assure a minimum spacing of 1.5 microns between the edge of the subcollector and the lateral diffusion, the spacing between the mask periphery of each of these two areas has generally been about 5 microns.

It should also be noted that the collector to substrate capacitance of the junction isolated IC's has two major components. The first, is the isolation diffusion to epitaxial layer, and the second is the subcollector to substrate capacitance components. Since the isolation diffusion in oxide isolated IC's is totally or partially replaced by oxide, the isolation diffusion to epitaxial layer capacitance is greatly reduced or eliminated. But for either of the processes, since the subcollector is diffused into the substrate, the subcollector to substrate capacitance is the sum of the sidewall and floor capacitance terms. The sidewall component of the subcollector to substrate capacitance is directly proportional to the peripheral area of the subcollector-substrate junction, which is determined by the subcollector mask dimensions and lateral and vertical junction depths of the subcollector into the substrate. On the other hand, the floor term is only directly proportional to the subcollector mask area.

As a result, the total subcollector to substrate capacitance can be quite accurately expressed analytically as $$C_{subc.-subs.} = C(X_m Y_m + \pi(X_m + Y_m)X_j + 2\pi X_j^2) \quad (1)$$

where C, $X_m$, $Y_m$, $X_j$, are subcollector to substrate capacitance per unit area, subcollector mask dimension in X and Y directions, and subcollector junction depth into the substrate measured from the epi-substrate interface, respectively. In deriving expression (1), it is assumed that the substrate is uniformly doped, the curved junction effects are negligible and lateral diffusion junction depth is equal to the vertical junction depth $X_j$. It should be noted that these assumptions hold quite well under general bipolar IC manufacturing processes.

As can be seen from (1), as the mask dimensions get smaller, the sidewall term will gain more importance in determining the total subcollector to substrate capacitance. Since the collector to substrate capacitance of the oxide isolated IC's is essentially determined by the subcollector to substrate capacitance, the sidewall capacitance becomes even more important compared to junction isolated IC's.

An object of the present invention is to provide a subcollector structure which allows increase of packing density.

Another object of the present invention is to provide a subcollector structure which reduces the subcollector to substrate capacitance.

Still another object of the present invention is to provide an improved subcollector structure which allows increased packing density and reduced subcollector to substrate capacitance requiring a minimum number of additional processing steps.

These and other objects are attained by forming a subcollector as a two-segment collector having a thick portion and a thin portion. The thick portion extends laterally between the projection of the emitter region onto the junction between the collector region and the substrate and a collector contact region which extends from the surface of the collector down to the buried subcollector region. The thin subcollector portion extends laterally from the thick portion towards tne lateral isolation of the collector region but spaced from the lateral isolation. The depth of the thick portions is substantially greater than that of the thin portion. Since the thin portion is adjacent to the lateral isolation, the side diffusion is substantially smaller than that for the deep portion and therefore the initial spacing in the mask is reduced thereby increasing packing density. Also, since peripheral area of the subcollector-substrate junction is decreased, the collector to substrate capacitance is reduced. The analytical expression for calculating the total subcollector to substrate capacitance of the structure explained, can be written as follows, assuming the same assumptions hold as in deriving expression (1), $$C_{subc.-subs.} = C(X_M Y_M + \pi(X_M + Y_M)X_{JSH} + 2\pi X_{JSH}^2 + 2(X_{MDD} + Y_{MDD})X_J(\pi/2 - \sin^{-1}(X_{JSH}/X_J)) + 2\pi X_J^2(1 - X_{JSH}/X_J)) \quad (2)$$

Where, C, $X_M$, $Y_M$, $X_J$, $X_{JSH}$, $X_{MDD}$, $Y_{MDD}$ are the subcollector to substrate capacitance per unit area, subcollector mask dimension in X and Y directions, deep and shallow subcollector junction depths into the substrates, both measured from the epi-substrate interface, and deep subcollector mask dimension in X and Y directions, respectively.

As can be seen from expression (2), the key factors in determining the capacitance reductions are $X_{JSH}/X_J$ and $(X_m + Y_M)/(X_{MDD} + Y_{MDD})$, or in other words the shallow to deep junction depth, and total subcollector peripheral to deep subcollector peripheral length ratios. It should also be noted that the total capacitance reduction increases as the total subcollector dimensions get smaller.

The lateral isolation may be a diffused junction region which extends from the surface of the collector down into the substrate or may be a buried junction isolated region (channel -stop) covered by a dielectric isolated region extending from the buried junction isolated region to the surface of the collector. In either case, the thin portion of the subcollector has a thickness at least as great as that of the lateral isolation region extending into the substrate.

The method of fabricating the new and improved subcollector region includes: masking the substrate of a first conductivity type and introducing second conductivity type impurities to define the thick portion of the subcollector; partially diffusing the impurities into the substrate; forming an additional mask to form the remainder or the thin portion of the subcollector region and introducing second conductivity type impurities to define the thin portion; providing a third mask which defines the buried portion of the lateral junction isolation and introducing first conductivity type impurities and forming an epitaxial layer of the second conductivity type on the substrate. The processing to form the bipolar transistors and its lateral isolation is the same as that of any other bipolar transistor.

Other objects, advantages and novel features of the present invention will become apparent from the following detailed description of the invention when considered in conjunction with the accompanying drawings.

DETAILED DESCRIPTION OF THE DRAWINGS

Figure 1:
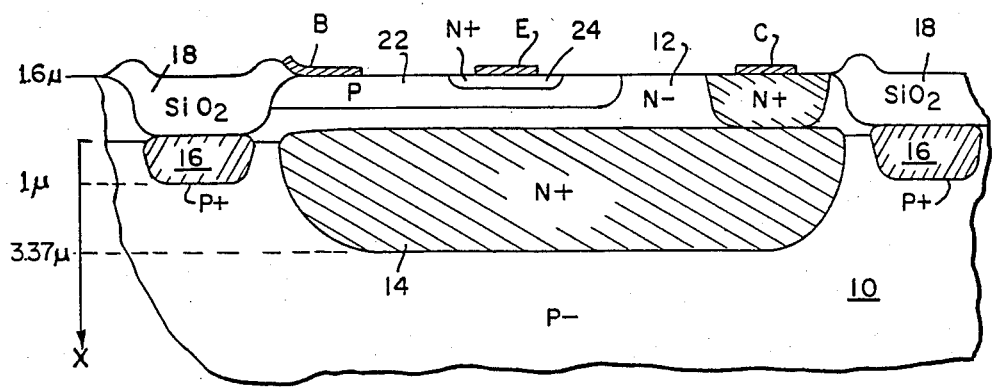
FIG. 1 is a cross-sectional view of the bipolar transistor of the prior art.

A vertical bipolar transistor according to the prior art is illustrated in FIG. 1 as including a substrate 10 of P− conductivity having an N− epitaxial layer 12 thereon. An N+ buried collector region 14 extends from the N− collector region 12 in the P− substrate 10 at their junction. A P+ junction isolation region 16 extends into the substrate 10 and is covered by a dielectric region 18. The dielectric region 18 and the buried P+ region 16 form the lateral isolation wherein the P− substrate 10 forms the bottom junction isolation. An N+ collector contact region 20 extends from the surface of the collector region 12 down into the buried collector region 14. A P base region 22 is formed in the surface of the collector region 12 spaced from the buried region 14 and includes an N+ emitter region 24 formed therein. Metal conducts are provided to the collector, base and emitter regions 20, 22 and 24 respectively.

Figure 2:
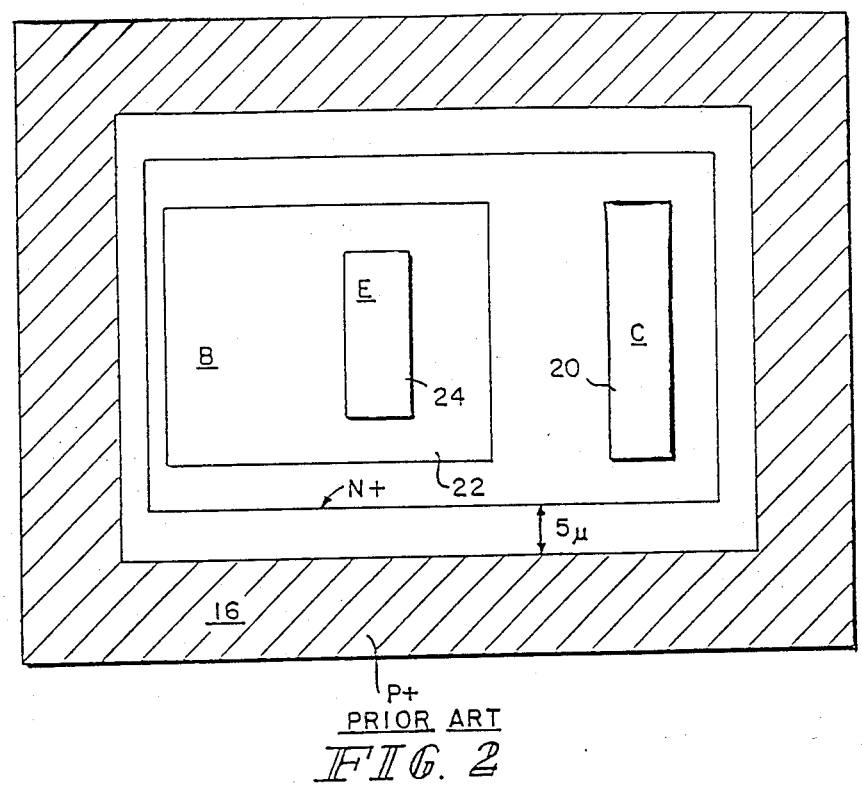
FIG. 2 is a plan view of the mask of the prior art to produce the bipolar transistor of FIG. 1.

As discussed in the Background of the Invention, the N+ buried region 14 extends substantially down into the P− substrate 10. For an epitaxial layer region 12 having a thickness of approximately 1.6 microns, the P+ buried collector region 14 is generally driven to a depth of 3.37 microns from the junction of the substrate 10 of the epitaxial collector region 12. This is compared to the one micron depth of the N+ lateral isolation region 16. In order to assure a minimum spacing of 1.5 microns between the N+ buried region 14 and the P+ lateral isolation region 16, the difference of spacing between the mask for these two regions for the drive-in depth previously described has been approximately 5 microns. It should be noted that the number on the mask of FIG. 2 correspond to the regions formed in FIG. 1.

Figure 3:
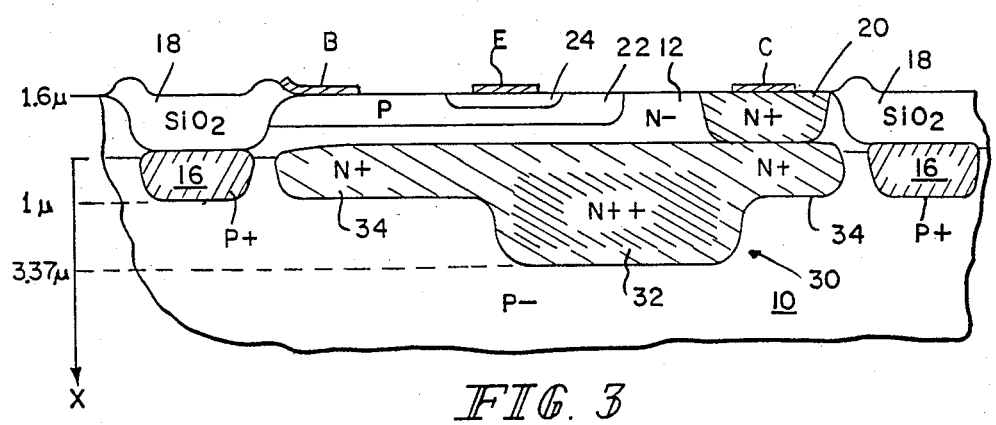
FIG. 3 is a cross-sectional view of a bipolar transistor incorporating the principles of the present invention.
Figure 4:
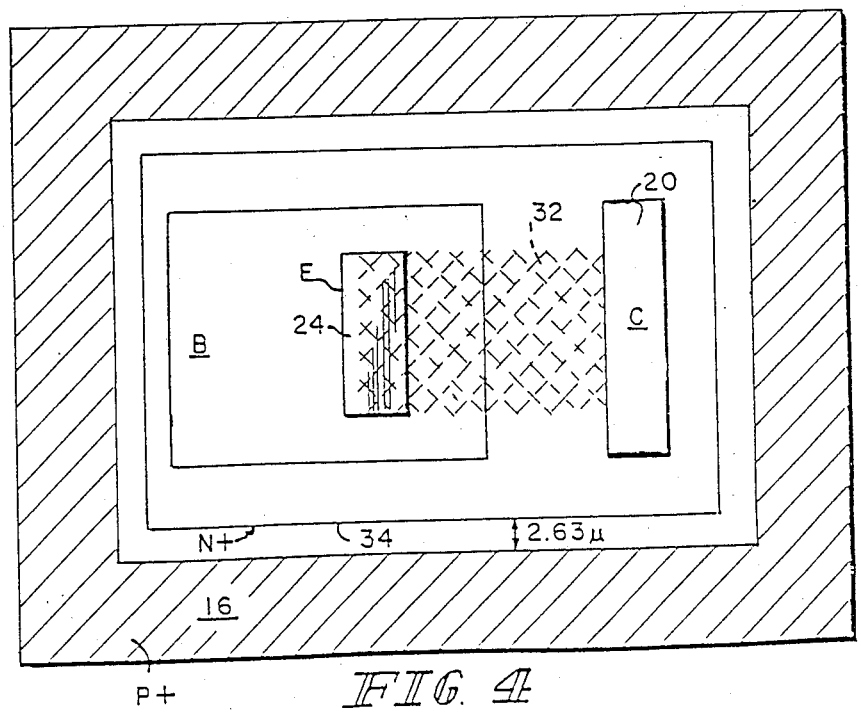
FIG. 4 is a plan view of a mask used to form the bipolar transistor of FIG. 3.

In an effort to reduce the required spacing of the masks of the subcollector region 14 and the lateral junction isolation region 16 and consequently the area required for each transistor, the subcollector region is formed of regions of two thicknesses. The region adjacent the junction isolation region has a minimum thickness thereby reducing lateral diffusion and allowing the separation of the mask for the thin subcollector region and the lateral isolation to be reduced. This also results in reduction of the side wall capacitance at the collector-substrate interface. The differences as illustrated in FIGS. 3 and 4, are that the subcollector region 14 of FIG. 1 is replaced by a deep N++ subcollector region 30 extending between the vertical projection of the emitter region 24 onto the junction and interface between the N− collector region 12 and the substrate 10 to the N+ collector contact region 20. A thinner subcollector region 34 extends laterally from the thick subcollector region 32 to the P+ lateral isolation region 16 but spaced therefrom. The thickness of the thin subcollector region 34 is at least that of the buried lateral isolation region 16. For the example of FIG. 3, this thickness is approximately 1 micron. For collector layers 12 having a thickness in the range of 1 to 1.8 microns, the thick portion 32 would have a depth in the range of 2.0 to 3.5 microns and the thin portion 34 in the range of 1 to 1.5 microns.

The thick region 32 extends across tne area which is the effective collector region and substantially reduces the parasitic transistor in that area. The thin N+ region 34 will not have as great effect to reduce the parasitic substrate PNP transistor, but the reduction in surface area as well as side wall capacitance substantially outweighs any increase in the current gain of the parasitic substrate transistor.

As illustrated in FIG. 4, the separation of the mask portion 34 for the thin oxide region and the mask region 16 for the P+ lateral junction isolation portion has been reduced to 2.63 microns. It has been found for the dimensional transistor just described, that the side wall capacitance has been reduced 38–40% while the overall area for the transistor is reduced in the range of 20–30%. The capacitance and area reduction increase as a fuction of the emitter length.

Figure 5:
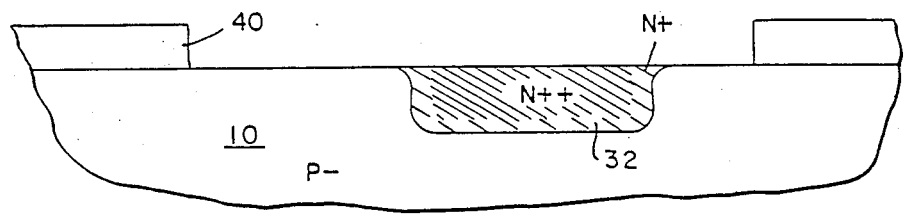
FIGS. 5–8 are cross-sectional views of a wafer at various stages of manufacture according to the principles of the present invention.

The method for forming the subcollector region of the present invention will now be discussed with respect to FIGS. 5–8. It will be noted that only a single additional mask is needed to form the two portion buried subcollector region. The process begins by forming a mask layer over the P− substrate region 10 and introducing the N conductivity type impurities (for example, Arsenic) at an impurity concentration which is the same as it would be for the conventional subcollector process to form the thicker N+ subcollector region 32. The impurities are then diffused to an initial depth of approximately 2–2.5 microns. Next, a mask 40 is formed defining the total collector region and N type impurities are introduced to form the extended or thin portion of subcollector region 34, as illustrated in FIG. 5. The process should be designed to have a final junction depth of approximately 1 micron into the substrate for the thin portion of the subcollector region, and having an impurity concentration approximately the same as the thick portion, at the substrate-epitaxial layer interface prior to epi deposition, which is approximately $1-2 \times 10^{19}$ cm$^{-3}$ for conventional processes, using standard processing techniques. It should be noted that the mask layer 40 may be the original mask layer used to form the thick subcollector region 32 wherein the opening is enlarged, or the regional mask layer may be removed and a second mask layer formed. Depending upon the desired depth of the thick region 32, N type impurities having different diffusion constants may be used and no prediffusion step performed for the thick region 32.

Figure 6:
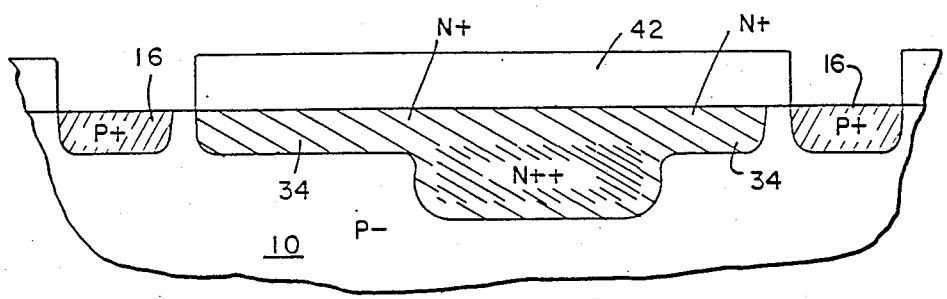

The mask layer 40 is removed and a second mask 42 is formed on the surface of the substrate 10 and openings are provided for the buried junction lateral isolation. P type impurities, for example, Boron, are introduced through openings in mask 42. The substrate at this stage is illustrated in FIG. 6.

Figure 7:
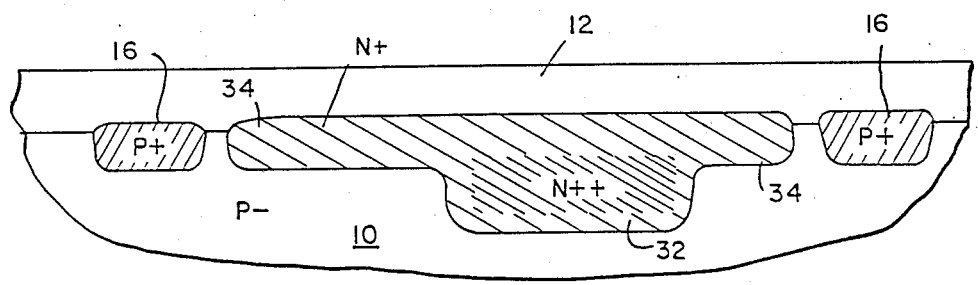
Figure 8:
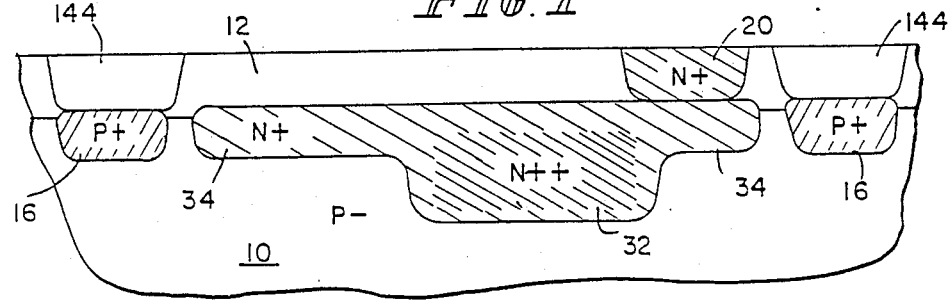

The mask layer 42 is removed and and N− collector layer 12 is formed by epitaxial deposition. During the epitaxial deposition, the P+ lateral isolation region 16 and the N+ subcollector regions 32 and 34 diffuse further into the substrate 10 as well as diffusing up into the epitaxial layer 20. The resulting structure is illustrated in FIG. 7. The processing from this point forward is standard processing depending upon the resulting structure of the bipolar transistor. This generally includes the formation of the remainder of lateral isolation dividing the epitaxial layer 20 into isolated regions. For the device illustrated in FIG. 3, the lateral isolation includes a dielectric region 18 which may be formed by local oxidation witn or without pre-etching, or etching and refill by oxide deposition. Alternatively, the lateral isolation may be totally junction isolation. As illustrated in FIG. 8, P type impurities are introduced through a mask to form regions 44 which extend from the surface of the collector region 12 down to the updiffused P+ regions 16. The N+ collector contact region 20 is also formed extending from the top surface of the collector region 12 down to the subcollector region 32, 34. The base regions then form through an appropriate mask by introducing P type impurities (for example, Boron) and the emitter region 24 is formed by introducing N+ impurity regions for example, through a mask into the base region 22. As discussed above, the emitter region 24 should be formed over the thick subcollector region 32.

It should be noted that if totally junction isolation regions are used, the side wall capacitance is not a major concern.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A bipolar vertical transistor comprising:
   a substrate of a first conductivity type;
   a collector region of a second conductivity type on said substrate and having a buried junction with said substrate;
   lateral isolation extending from a surface of said collector region to said substrate;
   a base region of said first conductivity type in a surface of said collector region;
   an emitter region of said second conductivity type in a surface of said base region;
   a subcollector region of said second conductivity type having a greater impurity concentration than said collector region at said junction between said collector region and said substrate;
   a collector contact region of said second conductivity type extending from said surface to said subcollector region; and
   said subcollector region having a thick portion extending laterally between the projection of said emitter region onto said junction and said collector contact region and extending vertical into said substrate a first depth and having a thin portion extending lateral from said thick portion toward but spaced from said lateral isolation and extending vertically into said substrate a second depth substantially less than said first depth.

2. A bipolar vertical transistor according to claim 1 wherein said lateral isolation extends into said substrate a third depth and said second depth is at least as deep as said third depth.

3. A bipolar vertical transistor according to claim 2 wherein said lateral isolation includes a doped region of said first conductivity type in said substrate and having an impurity concentration greater tnan the impurity concentration of said substrate.

4. A bipolar vertical transistor according to claim 3 wherein said lateral isolation includes a dielectric region extending from said surface to said doped isolation region.

5. A bipolar vertical transistor according to claim 3 wherein said doped isolation region extends from said substrate to said surface.

6. A bipolar vertical transistor according to claim 1 wherein said collector region is an epitaxial layer on said substrate.

7. A bipolar vertical transistor according to claim 1 wherein said subcollector region is spaced from said base region.

8. A bipolar vertical transistor according to claim 1 wherein said collector region has a thickness in the range of 1 to 1.8 microns, said first depth is in the range of 2 to 3.5 microns and said second depth is in the range of 1 to 1.5 microns.

9. A bipolar vertical transistor according to claim 1 wherein said second depth is less than half said first depth.

10. A bipolar vertical transistor according to claim 1 wherein said subcollector has a uniform resistance at said junction.

* * * * *